US008659109B2

(12) United States Patent
Roy

(10) Patent No.: US 8,659,109 B2
(45) Date of Patent: Feb. 25, 2014

(54) IMAGE SENSOR PHOTODIODE

(75) Inventor: François Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 54 days.

(21) Appl. No.: 12/984,067

(22) Filed: Jan. 4, 2011

(65) Prior Publication Data

US 2011/0183709 A1 Jul. 28, 2011

(30) Foreign Application Priority Data

Jan. 28, 2010 (FR) ...................................... 10 50565

(51) Int. Cl.
*H01L 31/00* (2006.01)

(52) U.S. Cl.
USPC ............ 257/445; 257/E31.127; 257/E21.001; 257/458; 257/461; 257/432; 257/446; 257/291; 257/290; 257/292

(58) Field of Classification Search
USPC ......... 257/458, 461, 431, 444, 446, 291, 290, 257/292, 445, E31.127, E21.001
See application file for complete search history.

(56) References Cited

U.S. PATENT DOCUMENTS

| 7,238,977 | B2 * | 7/2007 | Hong et al. .................... 257/292 |
| 8,395,194 | B2 * | 3/2013 | Yokoyama et al. ............ 257/230 |
| 2003/0137025 | A1 * | 7/2003 | Rhodes ........................ 257/444 |
| 2005/0167704 | A1 | 8/2005 | Ezaki et al. |
| 2005/0179053 | A1 | 8/2005 | Ezaki et al. |
| 2005/0230720 | A1 | 10/2005 | Miyagawa et al. |
| 2006/0033126 | A1 * | 2/2006 | Mouli ............................ 257/227 |
| 2007/0194356 | A1 | 8/2007 | Moon et al. |
| 2007/0246746 | A1 | 10/2007 | Ezaki et al. |
| 2008/0150071 | A1 | 6/2008 | Roy |
| 2008/0217724 | A1 * | 9/2008 | Uya .............................. 257/460 |
| 2009/0200588 | A1 | 8/2009 | Manabe et al. |
| 2009/0224351 | A1 * | 9/2009 | Hsieh ............................ 257/444 |
| 2010/0110271 | A1 * | 5/2010 | Yanagita et al. .............. 348/340 |
| 2010/0124952 | A1 * | 5/2010 | Moriizumi et al. ........ 455/575.1 |
| 2010/0148230 | A1 * | 6/2010 | Stevens et al. ................ 257/290 |
| 2011/0278436 | A1 * | 11/2011 | Rhodes et al. ............. 250/208.1 |
| 2012/0083066 | A1 * | 4/2012 | Kim ................................ 438/73 |
| 2012/0139018 | A1 * | 6/2012 | Narisawa ...................... 257/292 |

OTHER PUBLICATIONS

French Search Report dated Jul. 23, 2010 from corresponding French Application No. 10/50565.
J. Prima, et al., *Improved Color Separation for a Backside Illuminated Image Sensor With 1.4 μm Pixel Pitch*, 2009 International Image Sensor Workshop (IISW), Jun. 25-28, 2009, P002592900, Bergen, Norway.
Hirigoyen, F. et al, *1.1μm Backside Imager Vs, Frontside Imager: An Optics-Dedicated FDTD Approach* 2009 International Image Sensor Workshop, (IISW), Jun. 25-28, 2009, P002592900, Bergen, Norway.

* cited by examiner

*Primary Examiner* — Michael Shingleton
(74) *Attorney, Agent, or Firm* — Wolf, Greenfield & Sacks, P.C.

(57) ABSTRACT

An image sensor including a plurality of pixels each including a charge collection region including an N-type region bounded by P-type regions and having an overlying P-type layer; and an insulated gate electrode positioned over the P-type layer and arranged to receive a gate voltage for conveying charges stored in the charge collection region through the P-type layer.

35 Claims, 2 Drawing Sheets

IMAGE SENSOR PHOTODIODE

CROSS REFERENCE TO RELATED APPLICATIONS

This application claims the priority benefit of French patent application number 10/50565, filed on Jan. 28, 2010, entitled "Image Sensor Photodiode," which is hereby incorporated by reference to the maximum extent allowable by law.

BACKGROUND OF THE INVENTION

1. Field of the Invention

The present invention relates to an image sensor and to a method of forming an image sensor, and in particular to an image sensor comprising an array of pixels.

2. Discussion of the Related Art

Monolithic image sensors comprise photodiodes and transistors formed in a silicon substrate. More specifically, such image sensors comprise an array of pixels each having a pinned photodiode coupled to a sensing node by a transfer transistor. A charge accumulated by the photodiode during an integration period can be transferred to the sensing node via the transfer transistor.

Reading the voltage stored at the sensing node is performed using read circuitry, generally comprising a source follower transistor, having it gate coupled to the sensing node. Furthermore, a reset transistor is also provided coupled to the source, allowing the voltage of the source to be reset after each read. To reduce the number of components, the read circuitry is often shared by more than one photodiode.

The sensitivity and thus quality of the image sensor are, to some extent, determined by the charge holding capacity of each photodiode of the image sensor. In particular, if the photodiode becomes saturated during an integration period and can no longer store more charge, this results in a reduction in image quality.

SUMMARY OF THE INVENTION

Embodiments of the present invention aim to at least partially address one or more problems in the prior art.

According to one aspect of the present invention there is provided an image sensor comprising a plurality of pixels each comprising a charge collection region comprising an N-type region bounded by P-type regions and having an overlying P-type layer; and an insulated gate electrode positioned over the P-type layer and arranged to receive a gate voltage for conveying charges stored in the charge collection region through the P-type layer. The P-type layer is, for example, planar.

According to one embodiment, on at least one side, one of said P-type regions is a heavily doped P-type region between said charge collection region from an insulation trench.

According to one embodiment, said charge collection region is bounded on at least one side by a region of a P-type substrate, and wherein said P-type layer has a higher doping concentration than said P-type substrate.

According to one embodiment, a sensing region is positioned adjacent to said insulated gate electrode, and wherein said gate voltage conveys charges through the P-type layer to the sensing region.

According to one embodiment, said sensing node at least partially overhangs said charge collection region.

According to one embodiment, the charge collection region has a depth of between 0.5 µm and 2 µm.

According to one embodiment, the charge collection region has a width of between 0.05 µm and 0.4 µm.

According to one embodiment, the N-type region of the charge collection region has a doping concentration in the range $10^{15}$ to $5 \times 10^{17}$ at./cm$^3$.

According to one embodiment, said P-type layer has a doping concentration of between $10^{16}$ and $10^{18}$ at./cm$^3$.

According to one embodiment, said P-type layer has a thickness of between 20 and 150 nm.

According to one embodiment, each pixel further comprises a source follower transistor formed within a pixel region delimited by isolation trenches, said source following transistor being isolated on at least one side by a shallow trench isolation.

According to another aspect of the present invention, there is provided an electronic device comprising the above image sensor.

According to another aspect of the present invention, there is provided a mobile telephone comprising the above image sensor.

According to another aspect of the present invention, there is provided a method of manufacturing an image sensor comprising forming each pixel of said image sensor by: delimiting an N-type region of a charge collection region by P-type regions and an overlying P-type layer; forming an insulated gate electrode over said P-type layer arranged to receive a gate voltage for conveying a charge through said P-type layer.

According to one embodiment, the method further comprises forming a sensing node in said P-type substrate adjacent to said insulated gate electrode.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

Throughout the figures, like features have been labelled with like reference numerals. Furthermore, directional references throughout the description, such as overhanging, overlying, lateral, above, below etc., apply to circuits orientated as shown in the corresponding cross-section views.

DETAILED DESCRIPTION

Figure 1:
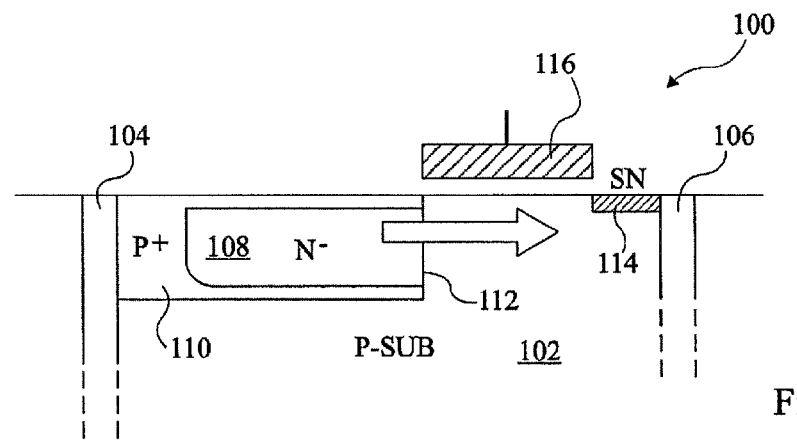
FIG. 1 is a cross-section view representing an example of a pixel of an image sensor.

FIG. 1 is a cross-section view illustrating a pixel 100 of an image sensor. As shown, within a P-type silicon substrate 102, a pixel region is delimited on either side by isolation trenches 104, 106. A photodiode is formed near the surface of the P-type substrate 102, and comprises a lightly doped N-type region 108 surrounded on all sides by a heavily doped P-type region 110, except on one lateral side 112. Charges resulting from light falling in the pixel region of pixel 100 are accumulated in region 108 during an integration phase of the image sensor. Such charges are then transferred during a transfer phase from region 108 to a sensing node 114 via a transfer transistor having a gate stack formed on the surface of the P-type substrate 102 between the heavily doped P-type region 110 and the sensing node 114. In particular, the charges leave region 108 via side 112, and are transferred to the sensing node 114 via a channel generated by applying a transfer voltage to the gate electrode 116 of the transfer transistor.

As explained above, it would be desirable to increase the volume of the N-type region 108, such that more charges may be stored. However, the width of the N-type region 108 is limited by the width of the pixel, and thus cannot be increased without increasing the pixel width, which would result in an increase in the overall size of the image sensor. On the other hand, it is difficult to increase the thickness of the N-type region 108 in the arrangement of FIG. 1, as this would lead to a greater distance between parts of the N-type region 108 and the gate electrode 116 of the transfer transistor, leading to inadequate charge transfer during the transfer phase.

Figure 2:
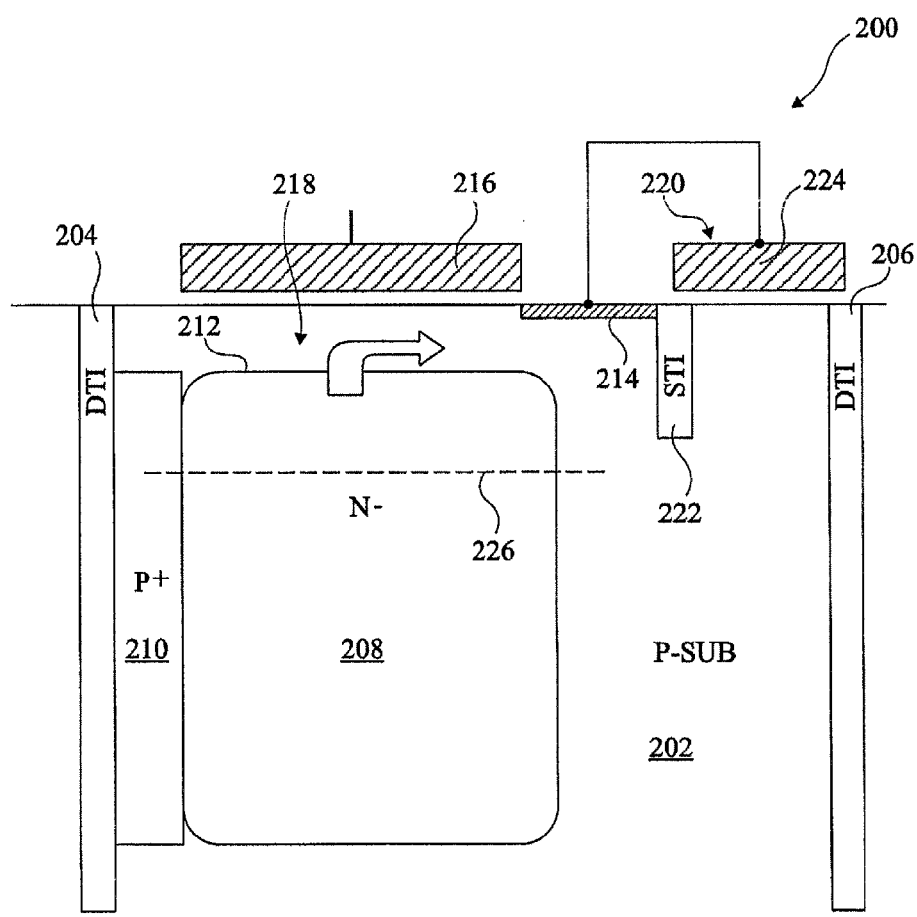
FIG. 2 is a cross-section view representing a pixel of an image sensor according to an embodiment of the present invention.

FIG. 2 is a cross-section illustrating a pixel 200 formed in a P-type substrate 202, and delimited on either side by deep trench isolations 204, 206. A photodiode of the pixel 200 is formed of a lightly doped N-type (N$^-$) region 208 in the P-type substrate 202. In this embodiment, region 208 has a width slightly narrower than the width of the N-type region 108 of FIG. 1, but a much greater thickness. In particular, while the thickness of the N-type region 108 is for example around 0.2 μm, and the width is around 0.4 μm, the thickness of region 208, is for example, approximately 1.2 μm, and it is around 0.2 μm wide, and this therefore implies an overall increase in the volume of 50 percent.

In alternative embodiments, the region 208 can have a width in the range of 0.05 μm to 0.4 μm, and a depth in the range 0.5 μm to 2 μm.

A heavily doped P-type region 210 forms a barrier positioned between the N-type region 208 and the DTI 204.

In this example the sensing node 214, for example formed of a heavily doped N-type region, is positioned on one side in plan view from the N type region 208, but may partially overhang the top of the N-type region 208.

Charge transfer from N-type region 208 to the sensing node 214 is possible due to a different arrangement of the transfer transistor in pixel 200 when compared to that of pixel 100. In particular, a gate stack of the transfer transistor is formed directly over the N-type region 208. In FIG. 2, for clarity, only the insulated gate electrode 216 of the gate stack of the transfer transistor is illustrated, and not the gate insulation, spacers etc. As shown in FIG. 2, the entirety of the insulated gate electrode 216 is positioned directly over the N-type region 208. The N-type region 208 is, for example, spaced from the surface of the P-type substrate by a distance of around 100 nm, leaving a layer 218 of P-type silicon having the same doping concentration as the P-type substrate 202 or a slightly lower concentration, for example of between $10^{16}$ and $10^{18}$ at./cm$^3$, through which charges are conveyed to the sensing node 214 during the transfer phase. In this way, during transfer from the N-type region 208 to the sensing node 214, charges are drawn up into the channel region 218 by a positive voltage applied to the gate electrode 216, for example of between 1 and 3 V, and once in the P-type layer 218, the charges are attracted towards the source region formed by the sensing node 214.

Furthermore, the P type region 210 helps to reduce the generation of dark current and ensure the evacuation of charge by repulsing them when the transfer voltage is applied to the gate electrode 216. In alternative embodiments, such a barrier is not used, for example if there is a greater spacing between the N-type region 208 and the edge of the pixel 100, or if the DTI 204 is active, meaning that it comprises a conductive core, to which may be applied a voltage that helps to both prevent reduce the dark current at the oxide/silicon interface of the DTI trench 204, ensure the evacuation of charge by repulsing them when the transfer voltage is applied.

In alternative embodiments, the thickness of the P-type layer 218 separating the N-type region 208 from the gate insulation layer of the transfer transistor could be between 20 and 150 nm.

In this embodiment, a transistor 220 forming a source follower transistor for reading the voltage at sensing node 214 is also positioned within the pixel region of pixel 200. This transistor 220 is isolated from the rest of the pixel by a shallow trench isolation (STI) 222, and is positioned between the STI 222 and the DTI 206. A gate electrode 224 of transistor 220 is coupled to the sensing node 214. A source and drain of transistor 220, not shown in FIG. 2, are, for example, formed on either side of the gate stack between the STI 222 and DTI 206.

During the integration phase, light falling on the pixel region delimited by DTIs 204, 206 results in an accumulation of charges in region 208. The image sensor is, for example, backside illuminated, in other words it is arranged such that the light falls on the opposite side of the device to the side on which the transfer transistor is formed. Thus the additional depth of the N-type region 208 facilitates the accumulation of charges resulting from light arriving from the backside.

Figure 3:
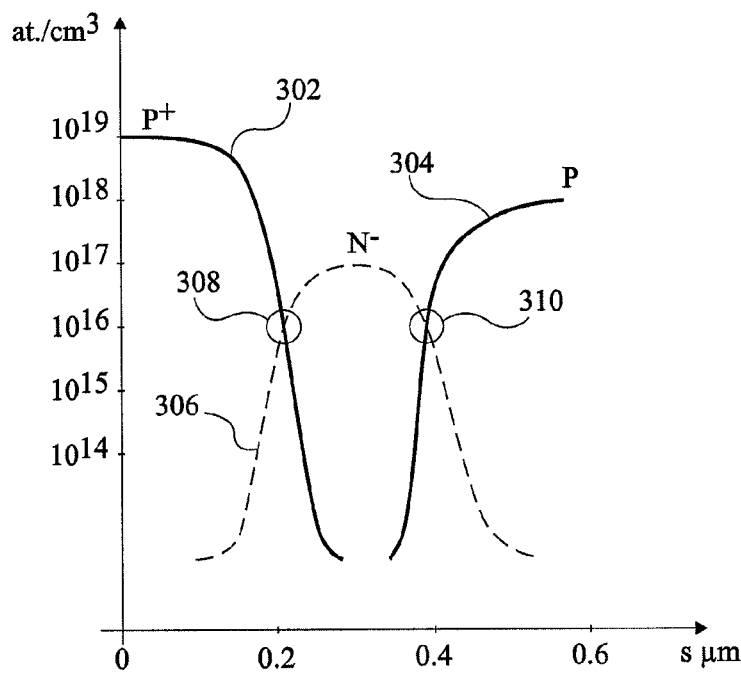
FIG. 3 is a graph showing doping concentrations for forming a photodiode of the pixel of FIG. 2 according to an embodiment of the present invention.

FIG. 3 is a graph showing an example of P and N type doping concentrations across the photodiode, for example at the depth of a dashed line 226 in the substrate of FIG. 2. Deep implantation at high energy can be used to achieve suitable doping concentrations all the way down to a depth of 1.2 μm or more.

The examples of the doping concentrations of the y-axis, in atoms per cm$^3$, are approximate, and the y-axis uses a log scale. Distance values s are shown on the x-axis, and correspond, for example, to the distance moving to the right from the DTI 204 of FIG. 2.

The P-type doping used to form the heavily doped P-type region 210 results, for example, in doping concentrations shown by curve 302, having a doping concentration of $10^{19}$ at./cm$^3$ or more at its peak, and falling to a very low concentration of less than $10^{14}$ at./cm$^3$ moving into the N-type region 208. The P-type doping used to form the P-type substrate results, for example, in doping concentrations shown by curve 304, which at their peak are at around $10^{18}$ at./cm$^3$, and fall to a very low concentration of less than $10^{14}$ at./cm$^3$ moving into the N-type region 208. The doping of the N-type region is shown by the dashed curve 306, and, for example, reaches a peak of around $10^{17}$ at./cm$^3$ close the center of region 208, and falls to low values of less than $10^{14}$ at./cm$^3$ moving into the P-type regions 210 and 202 on either side. The crossing points of curves 302, 304 with curve 306, labelled 308, 310 respectively in FIG. 3, correspond, for example, to doping concentrations in the range $10^{16}$ to $10^{17}$ at./cm$^3$, and it is the width between these points that determines the width of the N-type region, equal in this example to around 0.2 μm. Thus the N-type region 208 is pinched between the P-type regions, allowing a relatively narrow and deep N-type region, and allowing evacuation of the charge from this region of the photodiode via a central region at the highest doping level thanks to a lateral control of the N-type anode formed by region 208 provided by the P-type cathodes formed by regions 202 and 210. Thus, this favors a transfer of charge from the top of region 208.

Figure 4:
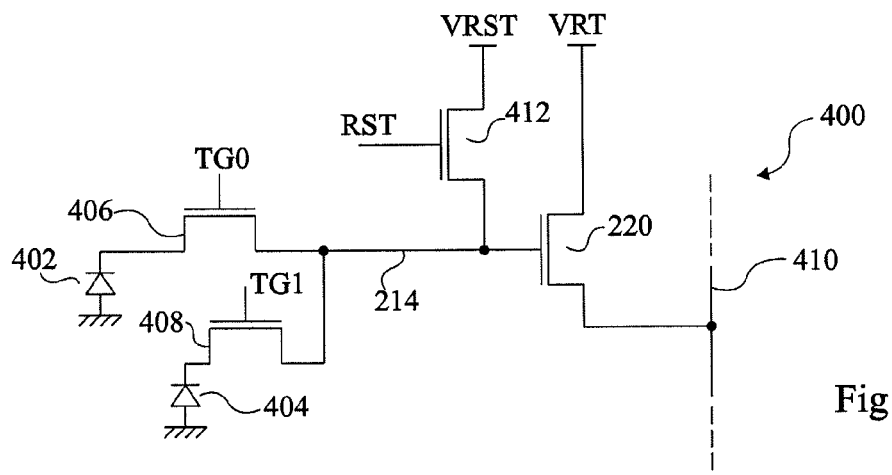
FIG. 4 illustrates schematically an example of a pixel circuit.

FIG. 4 illustrates an example of pixel circuitry 400 of an image sensor corresponding to a 2T pixel circuit type. In this example, the photodiodes 402, 404 of two pixel regions are coupled to a common sensing node 214 via respective transfer transistors 406, 408, which receive corresponding transfer voltages TG0 and TG1. The photodiodes 402, 404, for example, each have the structure described above in relation to FIG. 2.

Read circuitry of the pixel circuit 400 comprises a source follower transistor 220 having its gate coupled to sensing node 214, and its source coupled to an output line 410. A reset transistor 412 is coupled between the sensing node 214 and a reset voltage VRST, and receives at its gate a reset signal RST allowing the voltage at the sensing node 214 to be reinitialized to the voltage VRST.

Figure 5:
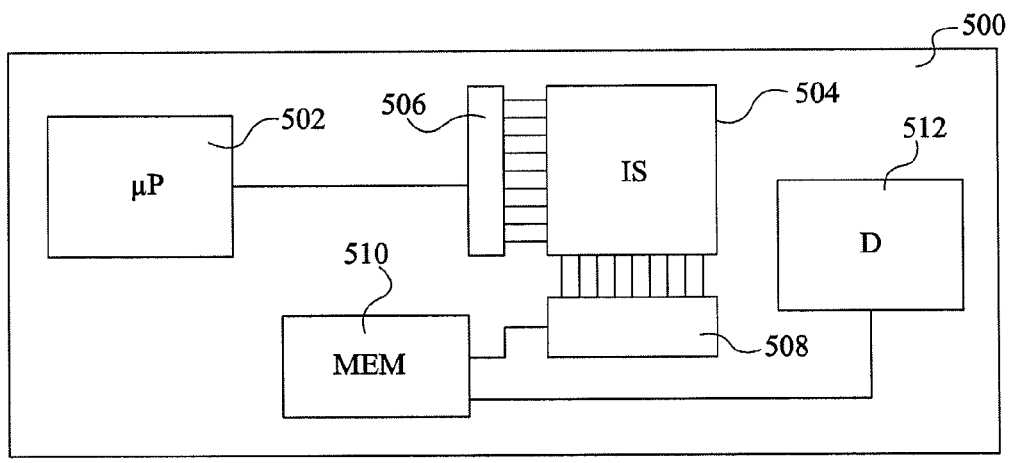
FIG. 5 illustrates an electronic image capturing device according to embodiments of the present invention.

FIG. 5 illustrates an electronic device 500, comprising a microprocessor 502, and an image sensor 504 for example comprising an array of the pixels as described herein, and associated with a control circuit 506, which generates signals for controlling the pixel circuits of the image sensor, such as transfer voltages for applying to the gate of the transfer transistor, read voltages and/or reset signals of the sensing node. Read circuitry 508 is also coupled to the image sensor, for example comprising switches and capacitors for sampling and storing voltage values read from the column read lines of the image sensor 504. A memory 510 stores images captured by the image sensor, and a display 512 displays captured images.

The electronic device 500 is, for example, a digital still and/or video camera, mobile device or portable games console having image capturing capabilities, a webcam, laptop computer or other digital image capturing device having an image sensor adapted to capture still images and/or video.

An advantage of the embodiments described herein is that the size of the N-region 208 of the photodiode can be enlarged without reducing the efficiency of charge transfer to the sensing node 214.

While a number of specific embodiments have been described, it will be apparent to those skilled in the art that numerous modifications and variations may be applied.

For example, in some embodiments the deep trench isolations 204, 206 that delimit the pixels may be replaced by shallow trench isolations. In some embodiments the source follower transistor 220 is not positioned within the pixel region, but adjacent to the pixels, along with other transistors such as reset and read transistors of the pixel circuits.

Furthermore, while the sensing node 214 has been described as partially overhanging the N-type region 208, in some embodiments it may not overhang the N-type region 208. In all cases, an appropriate P-type layer 218 is formed between the sensing node 214 and the N-type region 208.

While one example of a pixel circuit has been shown in FIG. 4, it will be apparent to those skilled in the art that the photodiode structure described herein could be used in a wide range of pixel circuits.

It will be apparent to those skilled in the art that the features described in relation to the various embodiments can be combined in any combination.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor comprising a plurality of pixels each comprising:
   a charge collection region comprising an N-type region bounded by P-type regions and having an overlying P-type layer, wherein the N-type region has a depth that is greater than a width thereof; and
   an insulated gate electrode positioned directly over the overlying P-type layer and the N-type region, and arranged to receive a gate voltage, the insulated gate electrode configured to convey charges between the charge collection region and the overlying P-type layer and between the overlying P-type layer and a sensing node, wherein an entirety of the insulated gate electrode is positioned directly over the N-type region.

2. The image sensor of claim 1, wherein one of said P-type regions is a heavily doped P-type region between said charge collection region and an isolation trench.

3. The image sensor of claim 1, wherein said charge collection region is formed in a P-type substrate, wherein said charge collection region is bounded on at least one side by a P-type region, and wherein said P-type region has a higher doping concentration than said P-type substrate.

4. The image sensor of claim 1, wherein the sensing node is positioned adjacent to said insulated gate electrode, and wherein said gate voltage conveys charges through the overlying P-type layer to the sensing node.

5. The image sensor of claim 4, wherein said sensing node at least partially overhangs said charge collection region.

6. The image sensor of claim 1, wherein the charge collection region has a depth of between 0.5 μm and 2 μm.

7. The image sensor of claim 1, wherein the charge collection region has a width of between 0.05 μm and 0.4 μm.

8. The image sensor of claim 7, wherein said N-type region of the charge collection region has a doping concentration in the range of $10^{15}$ to $5 \times 10^{17}$ at./cm$^3$.

9. The image sensor of claim 1, wherein said P-type layer has a doping concentration of between $10^{16}$ and $10^{18}$ at./cm$^3$.

10. The image sensor of claim 1, wherein said P-type layer has a thickness of between 20 and 150 nm.

11. The image sensor of claim 1, wherein each pixel further comprises a source follower transistor formed within a pixel region delimited by isolation trenches, said source follower transistor being isolated on at least one side by a shallow trench isolation.

12. An electronic device comprising the image sensor of claim 1.

13. A mobile telephone comprising the image sensor of claim 1.

14. A method of manufacturing an image sensor comprising forming each pixel of said image sensor by:
   forming in a substrate an N-type region of a charge collection region delimited by P-type regions and an overlying P-type layer, wherein the N-type region is formed to have a depth that is greater than a width thereof; and
   forming an insulated gate electrode directly over said overlying P-type layer and said N-type region, the insulated gate electrode arranged to receive a gate voltage for conveying charges between said charge collection region and said overlying P-type layer and between said overlying P-type layer and a sensing node, wherein an entirety of the insulated gate electrode is positioned directly over the N-type region.

15. The method of claim 14, further comprising forming the sensing node in said P-type substrate adjacent to said insulated gate electrode.

16. An image sensor pixel for an image sensor, comprising:
a charge collection region comprising an N-type region formed in a P-type substrate; wherein the N-type region has a depth that is greater than a width thereof;
an insulated gate positioned in its entirety directly over the N-type region;
a P-type layer between the N-type region and the insulated gate and overlying the N-type region; and
a sensing node, wherein the insulated gate is configured to control flow of charges between the charge collection region and the overlying P-type layer and between the overlying P-type layer and the sensing node in response to a gate voltage.

17. An image sensor pixel as defined in claim 16, further comprising a heavily-doped P-type barrier and a deep trench isolation, wherein the heavily-doped P-type barrier is located between the charge collection region and the deep trench isolation.

18. An image sensor pixel as defined in claim 16, wherein the sensing node at least partially overlaps the N-type region.

19. An image sensor pixel as defined in claim 16, wherein the insulated gate is a gate of a transfer transistor that controls flow of charge between the charge collection region and the sensing node.

20. An image sensor pixel as defined in claim 16, further comprising a source follower transistor having a gate coupled to the sensing node.

21. An image sensor pixel as defined in claim 20, wherein the source follower transistor is isolated by a shallow trench isolation.

22. An image sensor pixel as defined in claim 16, wherein a depth of the N-type region is greater than a width of the N-type region.

23. An image sensor pixel as defined in claim 16, wherein a width of the N-type region is in a range of 0.05 micrometer to 0.4 micrometer and a depth of the N-type region is in a range of 0.5 micrometer to 2 micrometers.

24. An image sensor pixel as defined in claim 16, wherein the P-type layer has the same or slightly lower doping concentration than the P-type substrate.

25. An image sensor pixel as defined in claim 16, wherein the P-type layer has a doping concentration between $10^{16}$ and $10^{18}$ at./cm$^3$.

26. An image sensor pixel as defined in claim 16, wherein the P-type layer has a thickness between 20 and 150 nanometers.

27. An image sensor pixel as defined in claim 16, wherein the N-type region has a doping concentration in a range of $10^{14}$ to $10^{17}$ at./cm$^3$.

28. An image sensor pixel as defined in claim 16, wherein charge is transferred through a top of the N-type region.

29. A method for making an image sensor pixel of an image sensor, comprising:
forming a charge collection region comprising an N-type region in a P-type substrate,. including forming the N-type region to have a depth that is greater than a width thereof;
forming an insulated gate positioned in its entirety directly over the N-type region;
forming a P-type layer between the N-type region and the insulated gate and overlying the N-type region; and
forming a sensing node, wherein the insulated gate is configured to control flow of charges between the charge collection region and the overlying P-type layer and between the overlying P-type layer and the sensing node in response to a gate voltage.

30. A method as defined in claim 29, further comprising forming a deep trench isolation in the substrate and forming a heavily-doped P-type barrier between the charge collection region and the deep trench isolation.

31. A method as defined in claim 29, further comprising forming a source follower transistor in the image sensor pixel.

32. A method as defined in claim 29, wherein forming the charge collection region comprises forming the N-type region such that a depth of the N-type region is greater than a width of the N-type region.

33. A method as defined in claim 29, wherein forming a charge collection region comprises forming the N-type region with a width in a range of 0.05 micrometer to 0.4 micrometer and a depth in a range of 0.5 micrometer to 2 micrometers.

34. A method as defined in claim 29, wherein forming a P-type layer comprises forming the P-type layer with a thickness in a range of 20 to 150 nanometers.

35. A method as defined in claim 29, wherein the charge collection region is formed such that charge is transferred from the top of the N-type region.

* * * * *